(12) United States Patent
Shen

(10) Patent No.: US 7,786,501 B2
(45) Date of Patent: Aug. 31, 2010

(54) FABRICATING PROCESS AND STRUCTURE OF THERMAL ENHANCED SUBSTRATE

(75) Inventor: Tzu-Shih Shen, Hsinchu (TW)

(73) Assignee: Subtron Technology Co., Ltd., Hsinchu (TW)

( * ) Notice: Subject to any disclaimer, the term of this patent is extended or adjusted under 35 U.S.C. 154(b) by 218 days.

(21) Appl. No.: 12/136,305

(22) Filed: Jun. 10, 2008

(65) Prior Publication Data

US 2008/0308925 A1 Dec. 18, 2008

(30) Foreign Application Priority Data

Jun. 14, 2007 (TW) .............................. 96121494 A

(51) Int. Cl.
*H01L 29/207* (2006.01)
(52) U.S. Cl. .............................. 257/99; 257/76; 257/95; 257/98; 257/100; 257/103
(58) Field of Classification Search ................... 438/43, 438/85
See application file for complete search history.

(56) References Cited

U.S. PATENT DOCUMENTS 6,599,768 B1 * 7/2003 Chen ........................... 438/22

\* cited by examiner

*Primary Examiner*—N Drew Richards
*Assistant Examiner*—Kyoung Lee
(74) *Attorney, Agent, or Firm*—J.C. Patents

(57) ABSTRACT

A fabricating process of a thermal enhanced substrate is provided for fabricating thermal conduction blocks to increase the heat dissipation area. First, a metallic substrate having a first surface and a second surface opposite to the first surface is provided. A first shallow trench with a first depth is then formed on the first surface. A second shallow trench with a second depth is formed on the second surface, and a deep trench penetrating the first shallow trench and the second shallow trench is formed, where the metallic substrate is separated into many thermal conduction blocks by the deep trench. At least one metallic layer and at least one insulating material are laminated on the thermal conduction blocks, and the insulating material is filled into the deep trench and covers the thermal conduction blocks.

6 Claims, 6 Drawing Sheets

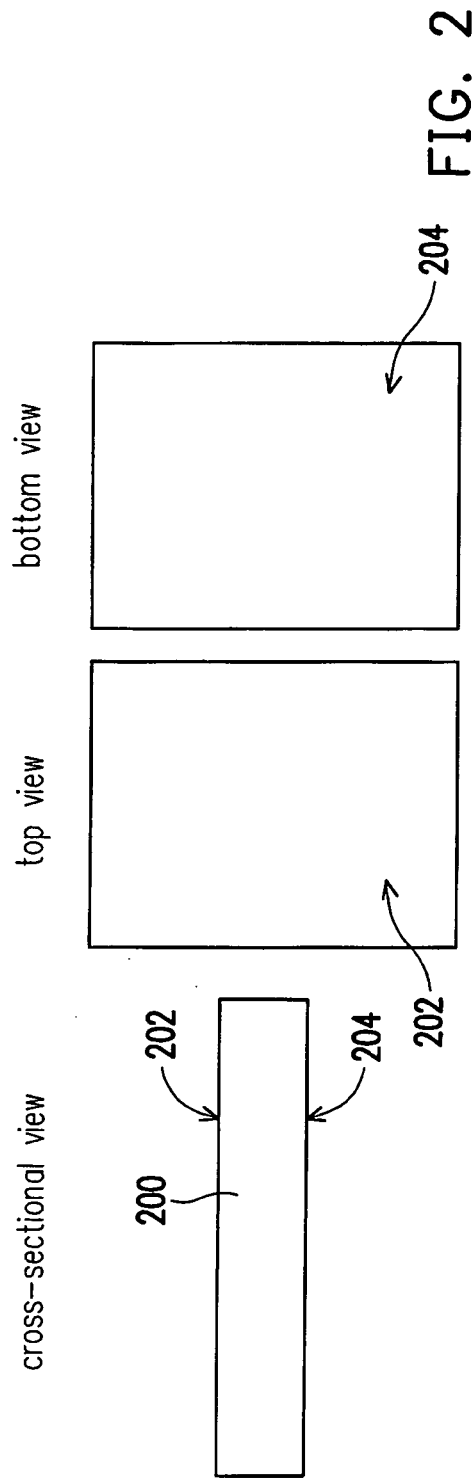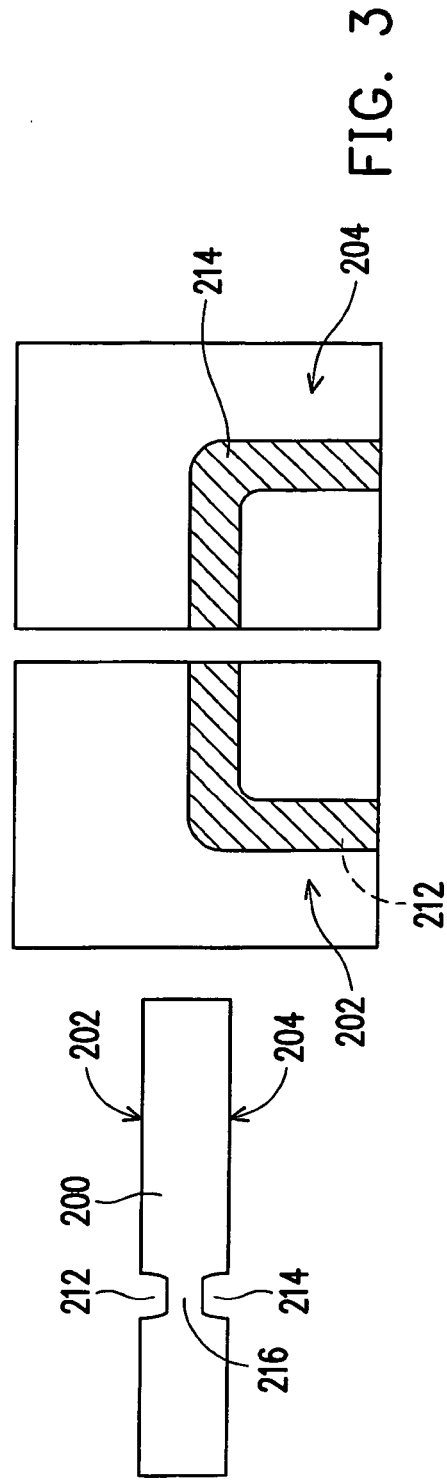

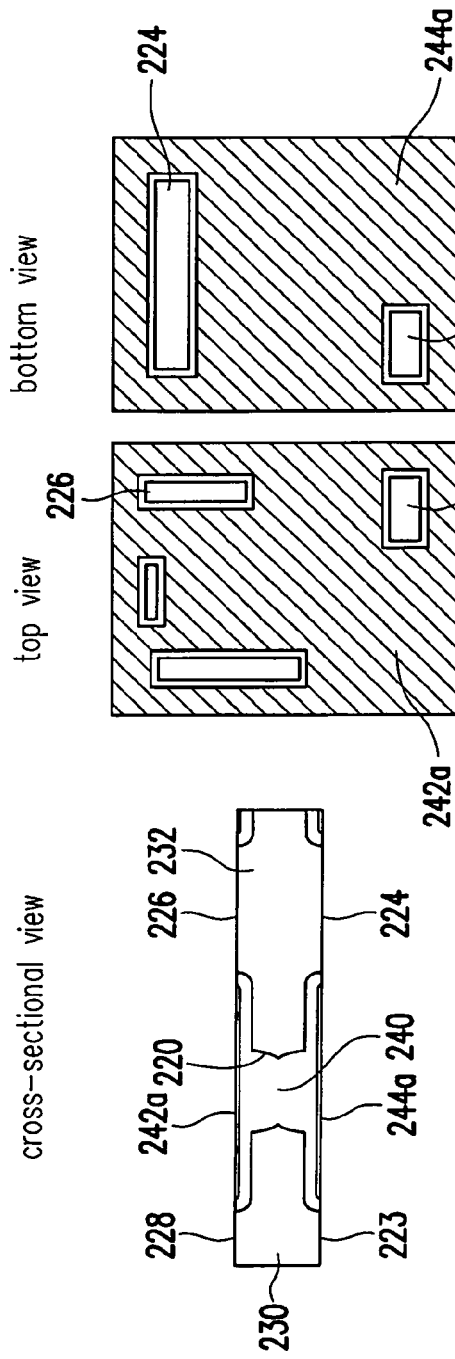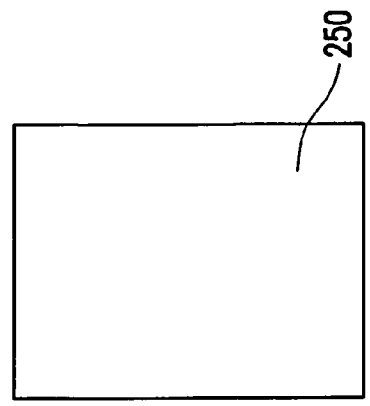

FABRICATING PROCESS AND STRUCTURE OF THERMAL ENHANCED SUBSTRATE

CROSS-REFERENCE TO RELATED APPLICATION

This application claims the priority benefit of Taiwan application serial no. 96121494, filed on Jun. 14, 2007. The entirety of the above-mentioned patent application is hereby incorporated by reference herein and made a part of this specification.

BACKGROUND OF THE INVENTION

1. Field of the Invention

The present invention relates to a metallic substrate, and more particularly to a fabricating process and a structure of a thermal enhanced substrate for being used by light emitting devices.

2. Description of Related Art

A Light Emitting Diode (LED) is a light emitting device mainly comprising III-V or II-IV group compound semiconductors. In comparison with the disadvantages of conventional bulbs, which are high electricity consumption, high heat radiation and poor shock resistance, because the operating principles and the structures of light emitting diodes are different from those of conventional bulbs, the light emitting diodes have numerous advantages including miniature sizes, durability, low-driven voltages, fast response speed and good shock resistance, and therefore they are widely applied to various fields of electronic products including portable communication products, traffic signs, outdoor display panels, illumination for vehicles and illuminators.

Nevertheless, along with the development of the fabricating techniques, the emitting efficiency of the light emitting diodes is gradually increased, so the emitting brightness can be advanced further more, thereby meeting and expanding the requirements for all kinds of illuminating products. In other words, in order to increase the brightness of the light emitting diodes, in addition to solving the outer package problems of the light emitting diodes, there is a need to design the light emitting diode with a higher power and a higher working current, in hope of fabricating the light emitting diode having high brightness. However, under the circumstance of increasing the power and the working current, the light emitting diodes will generate relatively more heat, so the performance thereof is easy to be compromised by overheat and in a serious situation, it even causes the malfunction of the light emitting diodes.

FIG. 1 is a schematic view of a conventional metallic substrate electrically connected with a light emitting diode by using a PTH (plated through hole). As shown in FIG. 1, a light emitting diode 100 is disposed on a thermal conduction block 112 of a metallic substrate 110, and an electrode of the light emitting diode 100 is electrically connected with a PTH (plated through hole) 114 of the metallic substrate 110 through a conductive wire 120, so as to drive the light emitting diode 100 to illuminate by a working current. In addition, most heat generated by the light emitting diode 100 can be dissipated through the conduction of the thermal conduction block 112, thereby preventing the working temperature of the light emitting diode 100 from being overly high.

Moreover, a small part of heat generated by the light emitting diode 100 is conducted to the PTH 114 through the conductive wire 120 and is then dissipated through conduction by the PTH 114. Because the volume of the PTH 114 is far smaller than that of the thermal conduction block 112, the PTH 114 does not help much in lowering the working temperature of the light emitting diode 100. Therefore, most heat has to be dissipated through the thermal conduction block 112 under the light emitting diode 100, and consequently the conventional metallic substrate 110 cannot provide a larger heat dissipation area. Besides, because the miniature PTH 114 is fabricated by performing a micro-fabricating process on the metallic substrate 110, the difficulty of the fabricating process is increased, thereby causing an increase of the cost in the fabricating process.

SUMMARY OF THE INVENTION

The present invention provides a fabricating process and a structure of a thermal enhanced substrate for increasing a heat dissipating area and simplifying the fabricating process to match the demands required by high power light emitting devices.

The present invention provides a fabricating process of a thermal enhanced substrate as follows. First, a metallic substrate having a first surface and a second surface opposite to the first surface is provided. A first shallow trench with a first depth is then formed on the first surface. A second shallow trench with a second depth is formed on the second surface, and a deep trench penetrating the first shallow trench and the second shallow trench is formed, wherein the deep trench separates the metallic substrate into a plurality of thermal conduction blocks; and at least one metallic layer and at least one insulating material are laminated on the thermal conduction blocks, wherein the insulating material is filled into the deep trench and covers the thermal conduction blocks.

In one embodiment of the present invention, the fabricating process of the thermal enhanced substrate further includes polishing a part of the metallic layer and the insulating material to expose surfaces which are intended to be exposed by each thermal conduction block and the insulating material.

In one embodiment of the present invention, the fabricating process of the thermal enhanced substrate further includes: completely electroplating a conductive layer on an unpolished part of the metallic layer and the surfaces which are intended to be exposed by each thermal conduction block and the insulating material; and patterning the aforesaid unpolished part of the metallic layer for forming a plurality of electrodes.

In one embodiment of the present invention, the first shallow trench and the second shallow trench are formed by a half-etching process.

The present invention provides a structure of a thermal enhanced substrate suitable for carrying a light emitting device. The structure includes: a metallic substrate having a deep trench, wherein the deep trench separates the metallic substrate into a plurality of thermal conduction blocks; an insulating material filled into the deep trench and covering the thermal conduction blocks; and at least one metallic layer laminated on the insulating layer.

In one embodiment of the present invention, the material of the metallic substrate includes copper.

In one embodiment of the present invention, the material of the metallic layer includes copper.

In one embodiment of the present invention, the structure of the thermal enhanced substrate further includes a conductive layer covering an unpolished part of the metallic layer and exposed surfaces of each thermal conduction block and the insulating material.

The fabricating process of the present invention can fabricate the metallic substrate having a plurality of thermal conduction blocks and do not need to fabricate the PTH, thereby reducing the process complexity and the process cost. Moreover, the thermal enhanced substrate of the present invention can be applied to a package structure of a high power light emitting device and thereby enlarge the scope of the products which the light emitting devices can be applied to.

In order to make the aforementioned and other objects, features and advantages of the present invention more comprehensible, preferred embodiments accompanied with figures are described in detail below.

BRIEF DESCRIPTION OF THE DRAWINGS

FIG. 2 to FIG. 8 are schematic views showing the steps of fabricating a thermal enhanced substrate according to one embodiment of the present invention.

DESCRIPTION OF EMBODIMENTS

Figure 1:
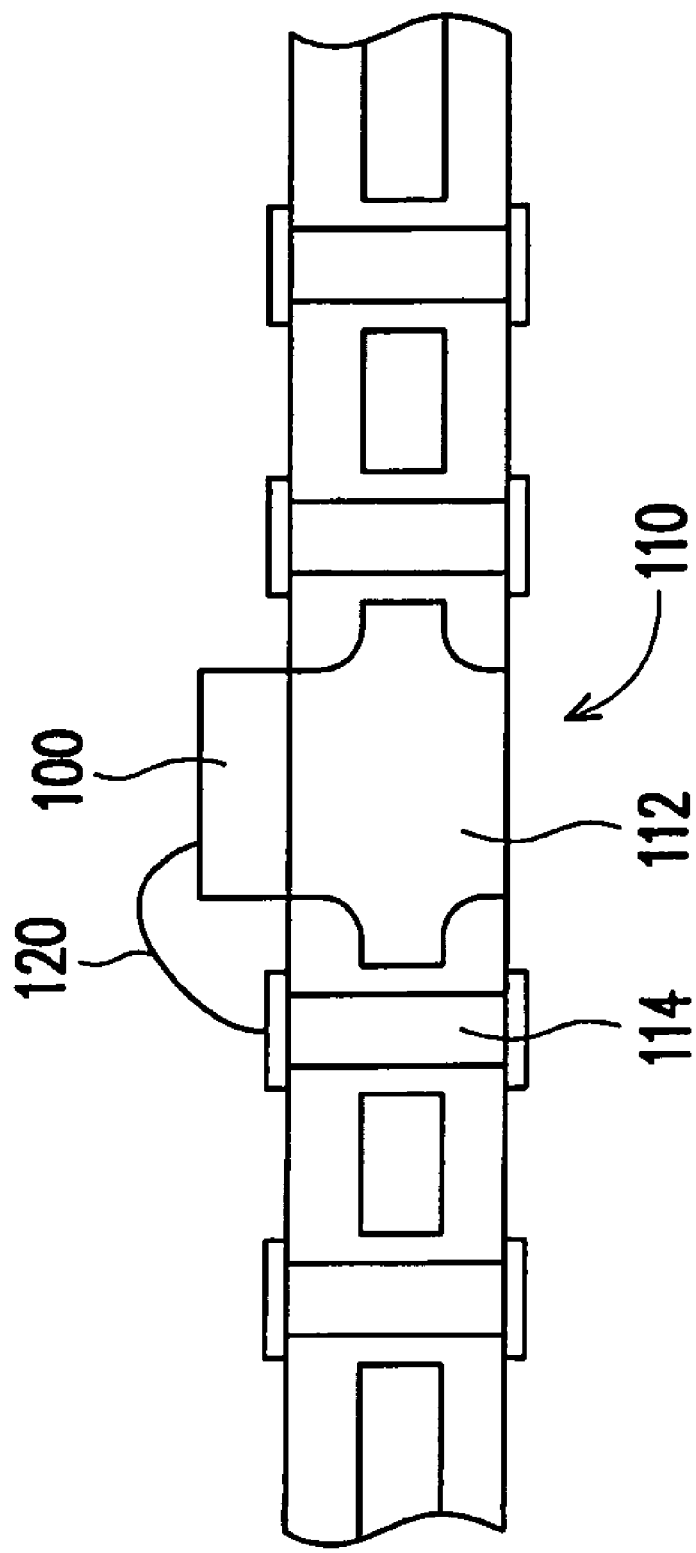
FIG. 1 is a schematic view of a conventional metallic substrate electrically connected with a light emitting diode by using a PTH (plated through hole).

FIG. 2 to FIG. 8 are schematic views showing the steps of fabricating a thermal enhanced substrate according to one embodiment of the present invention. To better describe the characteristics of the present invention, FIG. 2 to FIG. 8 schematically illustrate cross-sectional views, top views and bottom views. However, the drawings are not intended to limit the present invention and it will be apparent to one of the ordinary skill in the art that modifications of the shapes of any trench and trough can be made without departing from the spirit of the invention and should be deemed within the scope of the invention.

Referring to FIG. 2 and FIG. 3, a metallic substrate 200 is provided at first, then a first shallow trench 212 having a first depth is formed on a first surface 202 of the metallic substrate 200, and a second shallow trench 214 is formed on a second surface 204 of the metallic substrate 200. The metallic substrate 200 is, for example, a copper substrate which has better thermal conductivity, a copper alloy substrate, an aluminum substrate or an aluminum alloy substrate, wherein copper has excellent thermal conductivity and can rapidly conduct the heat generated by a light emitting device. Thereby, the working temperature of the light emitting device is decreased. The first shallow trench 212 is, for example, an etched trough formed by performing a half-etching process. The shape of an opening of the first shallow trench 212 can be formed by using an etchant to etch a predetermined pattern on the first surface 202 until removing a surface-layer metal with the first depth. The second shallow trench 214 is another etched trough formed by performing the half-etching process. The shape of an opening of the second shallow trench 214 can be formed by using an etchant to etch a predetermined pattern on the second surface 204 until removing a surface-layer metal with the second depth. The first depth or the second depth is not greater than half of the thickness of the metallic substrate 200, so an inner metal 216 with a thickness exists between the first shallow trench 212 and the second shallow trench 214 and separates them therefrom.

Figure 4:
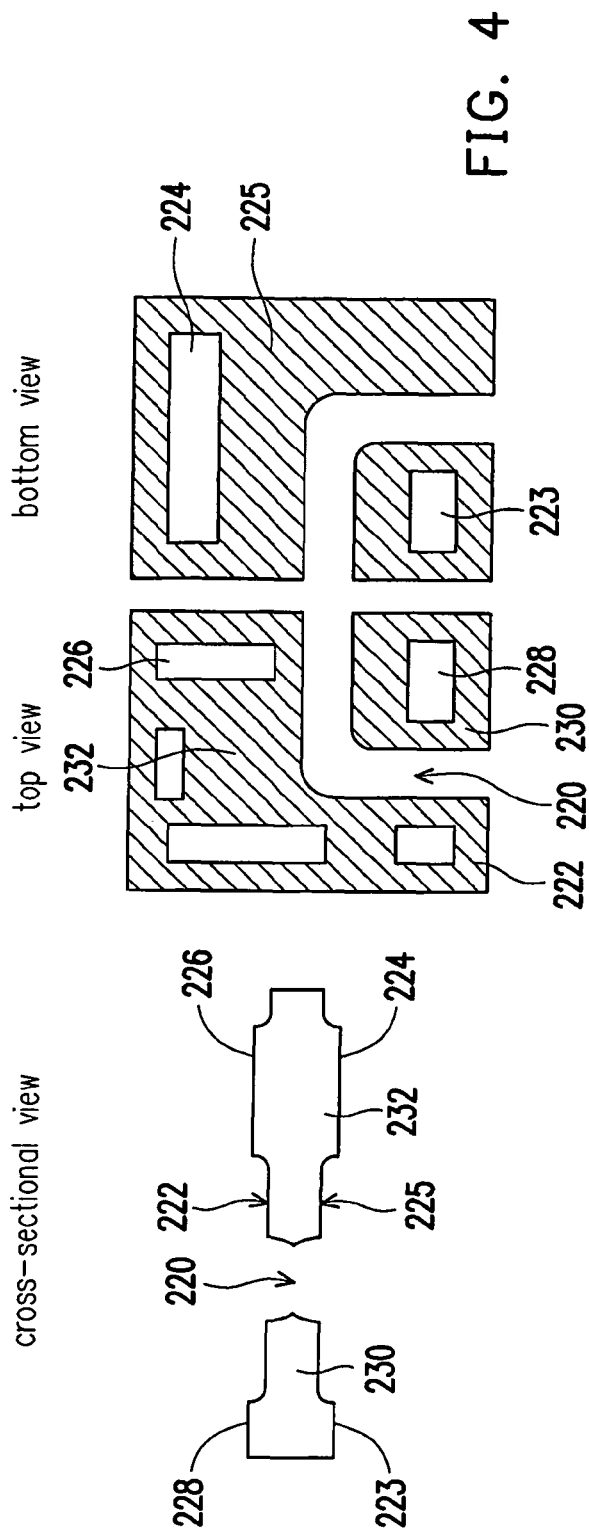

Then, referring to FIG. 4, a second etching process is performed on the first shallow trench 212 and the second shallow trench 214 for forming a deep trench 220 penetrating the first shallow trench 212 and the second shallow trench 214. Because the area etched by the second etching process is enlarged, besides the deep trench 220 formed by performing the downward etching process on the first shallow trench 212 and the second shallow trench 214, the surface around the first shallow trench 212 and the second shallow trench 214 is etched and forms shallow trench areas 222 and 225, wherein a plurality of un-etched surface layer metals 223, 224, 226 and 228 is relatively higher than the shallow trench areas 222 and 225. The shapes of openings of the deep trench 220 substantially resemble the patterns of the first shallow trench 212 and the second shallow trench 214 respectively, and the deep trench 220 completely etches through the metallic substrate 200. Therefore, the deep trench 220 separates the metallic substrate 220 into at least two thermal conduction blocks 230 and 232 for conducting the heat generated by the light emitting device and lowering the working temperature of the light emitting device.

Figure 5:
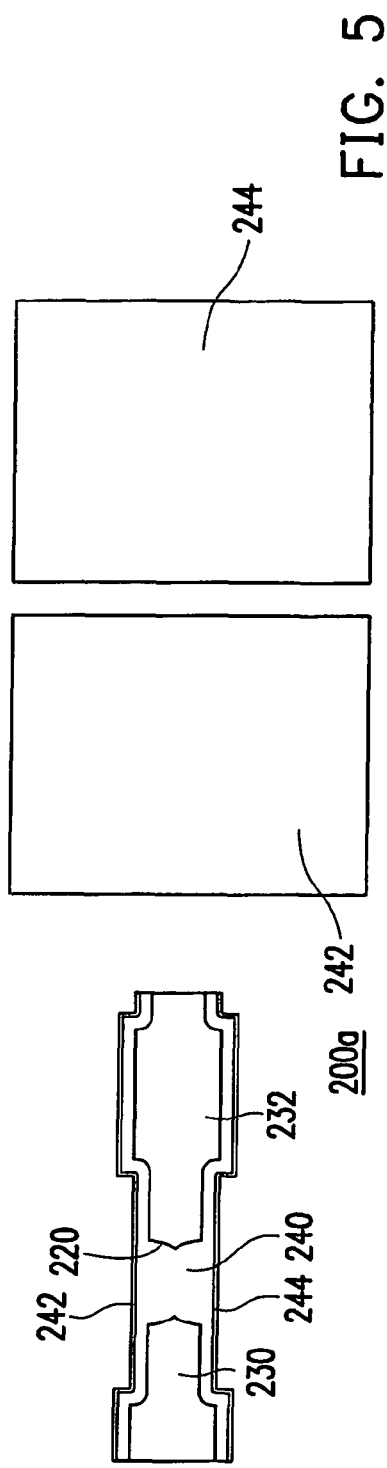

Next, referring to FIG. 5, an upper metallic layer 242, a lower metallic layer 244 and an insulating material 240 are laminated on the thermal conduction blocks 230 and 232. The insulating material 240 is, for example, a light-cured resin, a thermal-cured resin or other covering material. The insulating material 240 can be filled into the deep trench 220 and covers the thermal conduction blocks 230 and 232 before the insulating material 240 is cured. Then, the insulating material 240 is cured. In the present embodiment, the upper metallic layer 242 is laminated on an upper surface of the insulating material 240 while the lower metallic layer 244 is laminated on a lower surface of the insulating material 240. The upper metallic layer 242 and the lower metallic layer 244 are, for example, a copper foil, a coating copper foil or other metallic material, thereby forming a double-sided metallic substrate 200a enclosing a plurality of the thermal conduction blocks 230 and 232. In a subsequent manufacturing process, people skilled in the art can use the double-sided metallic substrate 200a to fabricate circuit patterns or electrode patterns as needed. Therefore, the subsequent manufacturing process merely provides an embodiment as a reference for the manufacturing industries and should not be used to limit the embodiments of the present invention.

Figure 8:
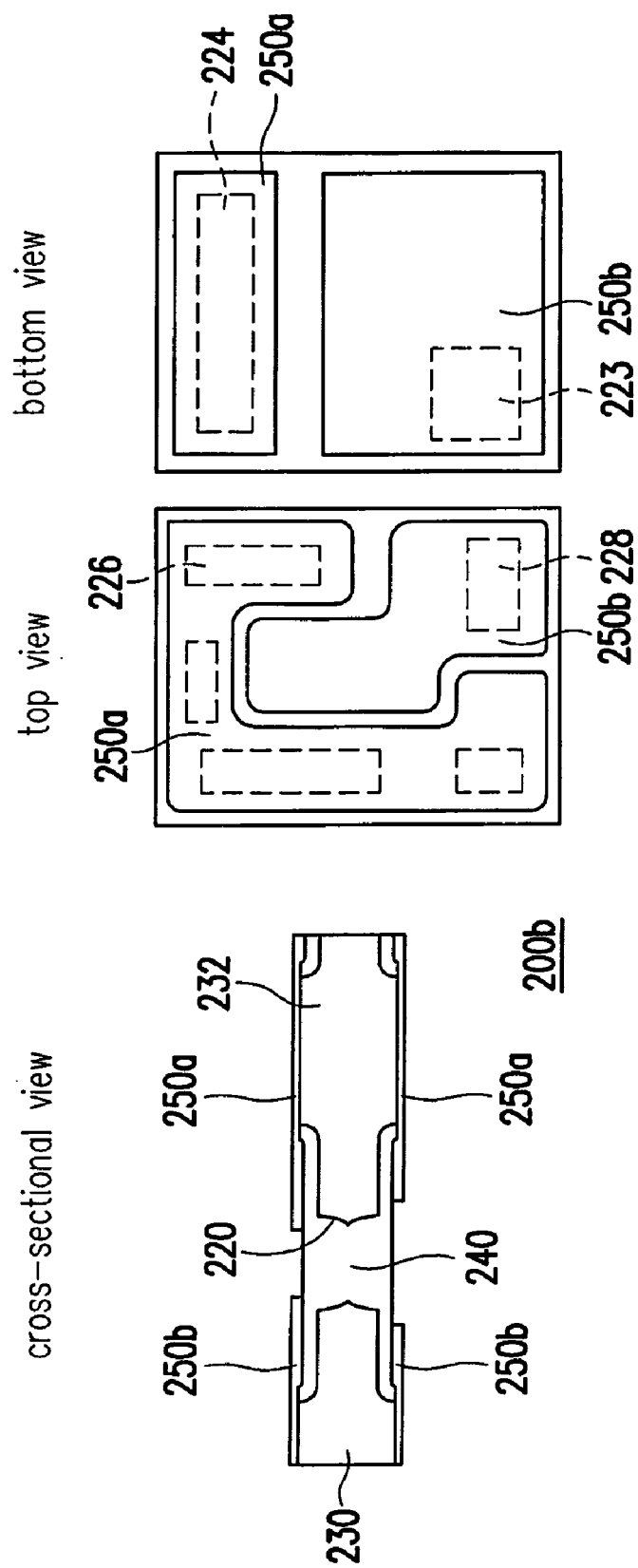
Figure 9:
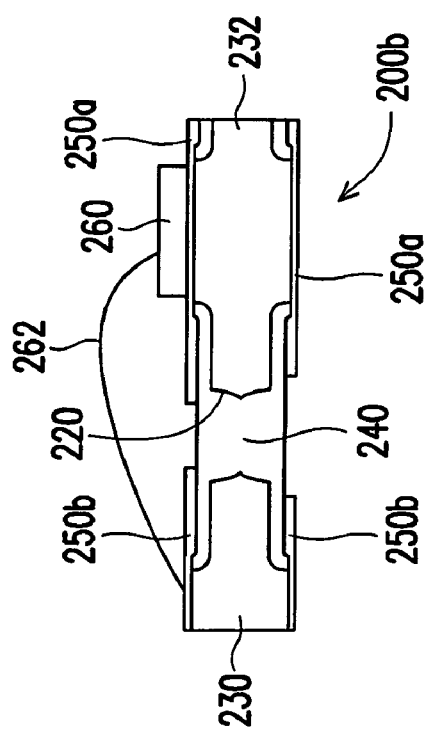
FIG. 9 and FIG. 10 are schematic views illustrating the present invention applied to package structures of two kinds of light emitting devices.
Figure 10:
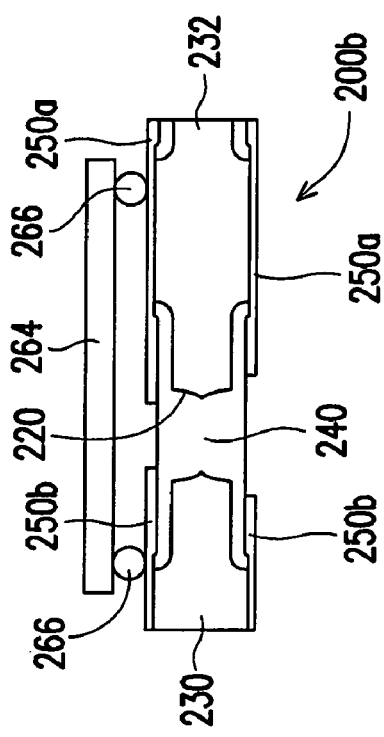

Please refer to FIG. 6 to FIG. 8. In FIG. 6, by polishing a part of the metallic layers 242 and 244, the surfaces which are intended to be exposed of the insulating material 240 and all the thermal conduction blocks 230 and 232 are exposed, which means the un-etched surface-layer metals 223, 224, 226 and 228 of the aforesaid thermal conduction blocks are exposed. In FIG. 7, in addition to unpolished parts 242a and 244a of the metallic layer, the exposed surfaces of the insulating material 240 and all the thermal conduction blocks 230 and 232 are completely electroplated with a conductive layer 250. The material of the conductive layer 250 is, for example, copper or other metals having excellent thermal conductivity. FIG. 8 illustrates that the unpolished parts 242a and 244a of the aforesaid metallic layer are patterned for forming at least two electrodes 250a and 250b on a package substrate 200b of the light emitting device. In FIG. 8, electrodes 250a and 250b are electrically connected to either the thermal conduction block 230 or the thermal conduction block 232 respectively. Compared with a conventional metallic substrate having only one thermal conduction block, the present invention conducts the heat generated by the light emitting device faster. Therefore, the present invention is more suitable to be used in a package structure of a high power light emitting device, so as to enlarge the scope of the products which the light emitting device can be applied to, such as a back light module of a liquid crystal display or a white light illumination device. Moreover, the present invention does not need to fabricate the PTH, thereby reducing the process complexity and the process cost. FIG. 9 and FIG. 10 are schematic views illustrating the present invention applied on package structures of two kinds of light emitting devices. Light emitting devices 260 and 264 are, for example, high power light emitting diodes. In FIG. 9, the light emitting device 260 is disposed on one thermal conduction block 232 and is electrically connected with another thermal conduction block 230 through a conductive wire 262. On one hand, the light emitting device 260 is driven to illuminate through a working current. On the other hand, the heat generated from the light emitting device 260 is dissipated through a plurality of the thermal conduction blocks 230 and 232, and thereby the heat dissipating area is increased significantly. Moreover, in FIG. 10, the light emitting device 264 can illuminate by electrically connecting all thermal conduction blocks 230 and 232 through a plurality of bumps 266, and the light emitting device 264 can dissipate heat at the same time, and thereby the heat dissipating area is increased significantly.

In summary, the fabricating process of the thermal enhanced substrate of the present invention can fabricate the metallic substrate having a plurality of the thermal conduction blocks and do not need to fabricate the PTH, thereby reducing the process complexity and the process cost. Moreover, the thermal enhanced substrate of the present invention can be applied to the package structure of the high power light emitting device and thereby enlarge the scope of the products which the light emitting devices can be applied to.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A structure of a thermal enhanced substrate, which is suitable for carrying a light emitting device, comprising:
   a metallic substrate having a deep trench, wherein the deep trench separates the metallic substrate into a plurality of thermal conduction blocks;
   an insulating material filled into the deep trench and covering the thermal conduction blocks; and
   at least one metallic layer laminated on the insulating material.

2. The structure of the thermal enhanced substrate according to claim 1, wherein the metallic layer further comprises a plurality of electrodes thereon for being electrically connected with the light emitting device.

3. The structure of the thermal enhanced substrate according to claim 1, further comprising a conductive layer covering an unpolished part of the metallic layer and exposed surfaces of the thermal conduction blocks and the insulating material.

4. The structure of the thermal enhanced substrate according to claim 3, wherein the material of the conductive layer comprises copper.

5. The structure of the thermal enhanced substrate according to claim 1, wherein the material of the metallic substrate comprises copper.

6. The structure of the thermal enhanced substrate according to claim 1, wherein the material of the metallic layer comprises copper.

* * * * *